United States Patent
Bishop et al.

(10) Patent No.: US 9,520,364 B2
(45) Date of Patent: Dec. 13, 2016

(54) FRONT SIDE PACKAGE-LEVEL SERIALIZATION FOR PACKAGES COMPRISING UNIQUE IDENTIFIERS

(71) Applicant: DECA Technologies Inc., Tempe, AZ (US)

(72) Inventors: Craig Bishop, Tucson, AZ (US); Sabbas A. Daniel, Los Altos, CA (US); Christopher M. Scanlan, Chandler, AZ (US)

(73) Assignee: DECA Technologies Inc., Tempe, AZ (US)

( * ) Notice: Subject to any disclaimer, the term of this patent is extended or adjusted under 35 U.S.C. 154(b) by 0 days.

(21) Appl. No.: 14/836,525

(22) Filed: Aug. 26, 2015

(65) Prior Publication Data

US 2016/0064334 A1   Mar. 3, 2016

Related U.S. Application Data

(60) Provisional application No. 62/042,183, filed on Aug. 26, 2014.

(51) Int. Cl.
*H01L 21/44* (2006.01)
*H01L 23/544* (2006.01)
(Continued)

(52) U.S. Cl.
CPC .......... *H01L 23/544* (2013.01); *H01L 21/768* (2013.01); *H01L 21/78* (2013.01); *H01L 22/12* (2013.01);
(Continued)

(58) Field of Classification Search
CPC ....... H01L 23/544; H01L 21/561; H01L 22/12
See application file for complete search history.

(56) References Cited

U.S. PATENT DOCUMENTS 7,265,454 B2    9/2007  Seddon et al.
2005/0277210 A1  12/2005  Raitter
(Continued)

FOREIGN PATENT DOCUMENTS

EP    1557876 A1    7/2005

OTHER PUBLICATIONS

Jerry Secrest, Die Traceability, http://electroiq.com/blog/2002/01/die-traceability/.

*Primary Examiner* — Bradley K Smith
(74) *Attorney, Agent, or Firm* — Booth Udall Fuller, PLC

(57) ABSTRACT

A method of making a semiconductor device can include providing a plurality of semiconductor die, wherein each semiconductor die comprises an active surface and a backside opposite the active surface. The method can include forming a build-up interconnect structure that extends over the active surface of each of the plurality of semiconductor die within the wafer, and forming a unique identifying mark for each of the plurality of semiconductor die as part of a layer within the build-up interconnect structure while simultaneously forming the layer of the build-up interconnect structure. The layer of the build-up interconnect structure can comprise both the unique identifying marks for each of the plurality of semiconductor die and functionality for the semiconductor device. Each unique identifying mark can convey a unique identity of its respective semiconductor die. The method can further include singulating the plurality of semiconductor die into a plurality of semiconductor devices.

24 Claims, 8 Drawing Sheets

(51) Int. Cl.
  *H01L 21/768* (2006.01)
  *H01L 21/78* (2006.01)
  *H01L 21/66* (2006.01)
  *H01L 23/00* (2006.01)
  *H01L 21/56* (2006.01)

(52) U.S. Cl.
  CPC ............... *H01L 24/19* (2013.01); *H01L 24/96* (2013.01); *H01L 24/97* (2013.01); *H01L 21/561* (2013.01); *H01L 21/568* (2013.01); *H01L 2223/5448* (2013.01); *H01L 2223/54406* (2013.01); *H01L 2223/54413* (2013.01); *H01L 2223/54433* (2013.01); *H01L 2224/04105* (2013.01); *H01L 2224/12105* (2013.01); *H01L 2224/94* (2013.01); *H01L 2924/13091* (2013.01)

(56) References Cited

U.S. PATENT DOCUMENTS

| | | | |
|---|---|---|---|
| 2007/0170381 A1* | 7/2007 | Little | H01L 23/544 250/559.44 |
| 2009/0277004 A1* | 11/2009 | Kotani | G03F 1/14 29/829 |
| 2011/0156033 A1* | 6/2011 | Bintang | H01L 21/67294 257/48 |
| 2011/0248412 A1 | 10/2011 | Banach et al. | |
| 2012/0319307 A1* | 12/2012 | Wang | H01L 23/544 257/797 |
| 2013/0168849 A1 | 7/2013 | Scanlan | |

\* cited by examiner

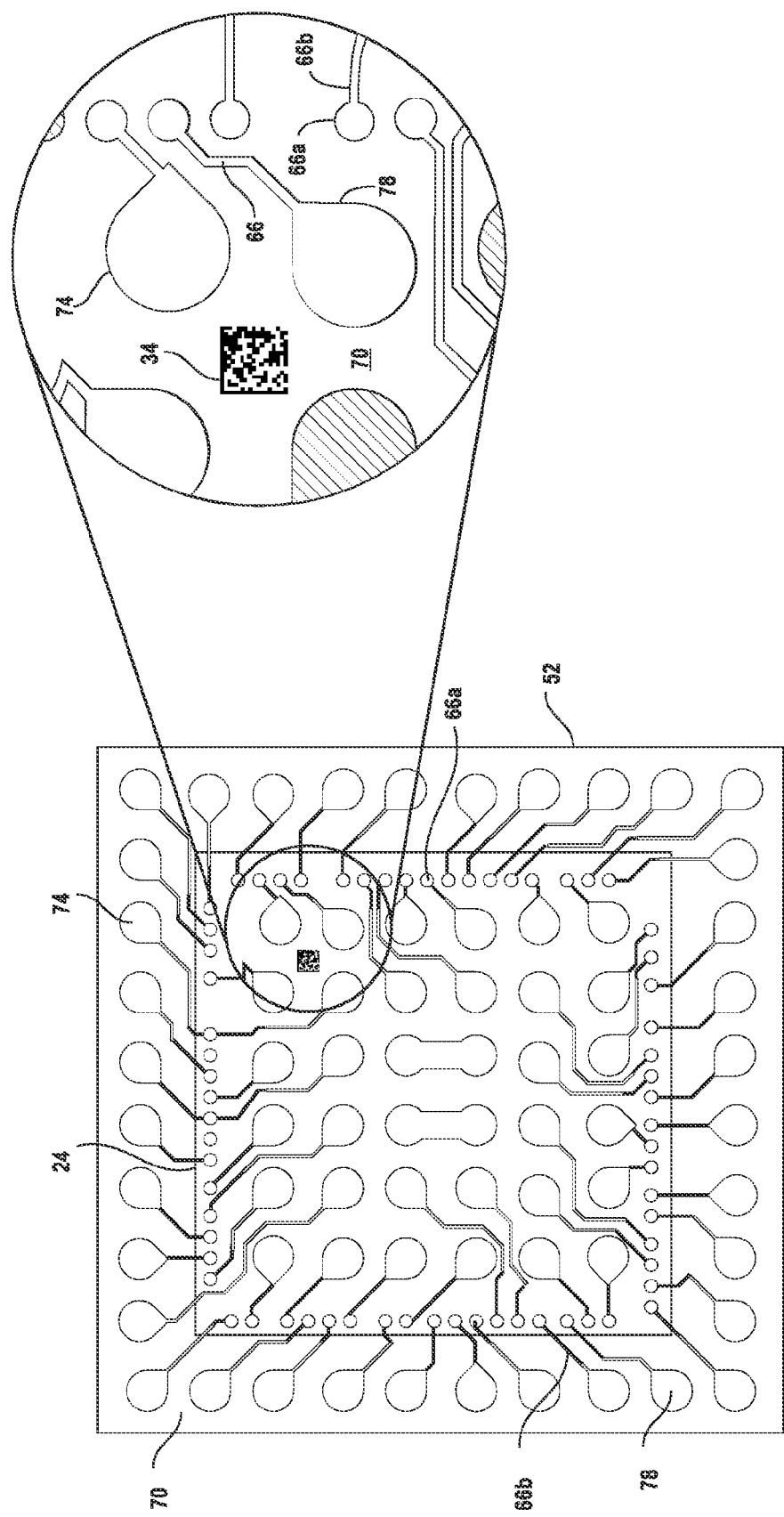

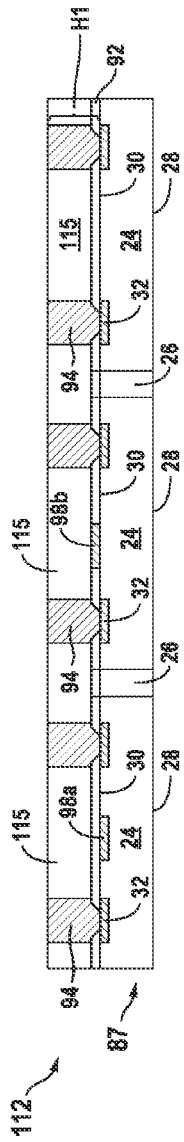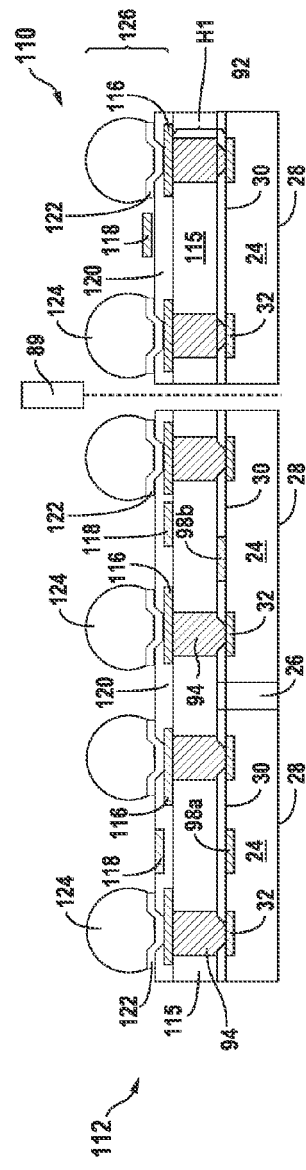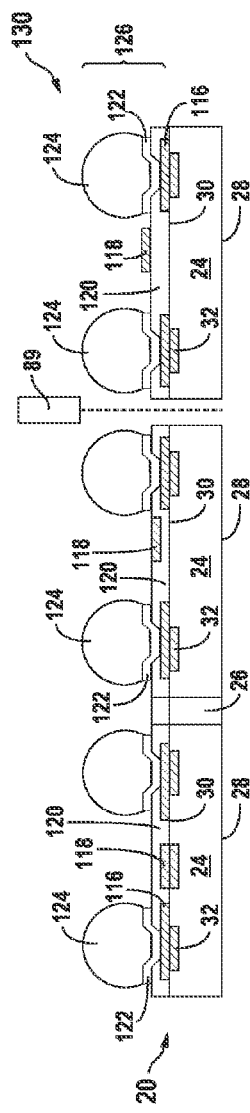

FRONT SIDE PACKAGE-LEVEL SERIALIZATION FOR PACKAGES COMPRISING UNIQUE IDENTIFIERS

RELATED APPLICATIONS

This application claims the benefit of U.S. Provisional Application No. 62/042,183, filed Aug. 26, 2014, the entirety of the disclosure of which is hereby incorporated by this reference.

TECHNICAL FIELD

The disclosure relates in general to semiconductor devices and packaging, and more particularly to identification, tracking, or both, of semiconductor packages and package components, such as semiconductor die, using package-level serialization.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. The term "semiconductor die" as used herein refers to both the singular and plural form of the words, and accordingly can refer to both a single semiconductor device and multiple semiconductor devices. During front-end manufacturing, or fabrication of semiconductor die at on a native wafer, each semiconductor die is typically identical and contains circuits formed by electrically connecting active and passive components. Individual semiconductor die can be marked with identifiers, such as laser markings on a backside of the semiconductor die, to identify, track, or both, semiconductor die. The marking of semiconductor die can be before singulation of the semiconductor die from the native semiconductor wafer. Back-end manufacturing can involve singulating individual semiconductor die from the finished wafer and packaging the die to provide structural support and environmental isolation. Marking of semiconductor die packages can also occur during back-end manufacturing. During back-end manufacturing, marking and identification of semiconductor die and semiconductor packages can be accomplished by using laser marking or ink printing to identify wafers and strips of semiconductor packages through packaging and testing.

SUMMARY

The foregoing and other aspects, features, and advantages will be apparent to those artisans of ordinary skill in the art from the DESCRIPTION and DRAWINGS, and from the CLAIMS.

Accordingly, in one aspect, a method of making a semiconductor device can comprise providing a plurality of semiconductor die, wherein each semiconductor die comprises an active surface and a backside opposite the active surface. The method can comprise forming a build-up interconnect structure that extends over the active surface of each of the plurality of semiconductor die within the wafer. The method can comprise forming a unique identifying mark for each of the plurality of semiconductor die as part of a layer within the build-up interconnect structure while simultaneously forming the layer of the build-up interconnect structure. The layer of the build-up interconnect structure can comprise both the unique identifying marks for each of the plurality of semiconductor die and functionality for the semiconductor device. Each unique identifying mark can convey a unique identity of its respective semiconductor die. The method can comprise singulating the plurality of semiconductor die into a plurality of semiconductor devices.

The method of making the semiconductor device can further comprise forming the layer of the build-up interconnect structure as a conductive layer, forming the unique identifying mark for each of the plurality of semiconductor die as a first portion of the conductive layer, and forming a second portion of the conductive layer as a redistribution layer (RDL). The method can further comprise forming the unique identifying mark for each of the plurality of semiconductor die within the build-up interconnect structure and away from an exterior surface of the semiconductor package such that the unique identifying mark for each of the plurality of semiconductor die are not subject to damage at an exterior surface of the semiconductor package. The method can further comprise forming the unique identifying mark for each of the plurality of semiconductor die within the build-up interconnect structure in a position that is optically detectable from an exterior of the semiconductor device. The method can further comprise forming the unique identifying mark as a machine-readable 2-dimensional code or an alpha-numeric mark. The unique identity of the semiconductor die can be conveyed by each of the respective unique identifying marks comprising source wafer identification and the x, y location of the semiconductor die within the source wafer. The information conveyed by each of the respective unique identifying marks can further comprise a reconstituted wafer or panel identification and an x, y location of the semiconductor device within the reconstituted wafer. The method can further comprise forming the reconstituted wafer by disposing an encapsulant around the plurality of semiconductor die before forming the build-up interconnect structure.

In another aspect, a method of making a semiconductor device can comprise providing a plurality of semiconductor die, forming a functional layer that extends over the active surface of each of the plurality of semiconductor die, the functional layer further comprising a unique identifying mark for each of the plurality of semiconductor die, and singulating the plurality of semiconductor die. Each semiconductor die can comprise an active surface and a backside opposite the active surface. Each unique identifying mark can convey a unique identity of its respective semiconductor die.

The method of making the semiconductor device can further comprise forming the functional layer comprising a build-up interconnect structure, and forming the unique identifying mark for each of the plurality of semiconductor die simultaneously with forming the build-up interconnect structure. The method can further comprise forming the unique identifying mark for each of the plurality of semiconductor die as a first portion of the build-up interconnect structure, and forming a second portion of the build-up interconnect structure as a RDL. The method can further comprise forming the unique identifying mark and the functional layer in the build-up structure with a maskless patterning system. The method can further comprise forming the unique identifying mark for each of the plurality of semiconductor die away from an exterior surface of a semiconductor package such that the unique identifying mark for each of the plurality of semiconductor die are not subject to damage at an exterior surface of the semiconductor package. The method can further comprise forming the unique identifying mark for each of the plurality of semiconductor die in a position that is optically detectable from an exterior of the semiconductor device. The method can further comprise forming the unique identifying mark as a machine-readable barcode or 2-dimensional matrix. The unique identity of the semiconductor die conveyed by each of the respective unique identifying marks can comprise source wafer identification, an x, y location of the semiconductor die within a source wafer, a reconstituted wafer or panel identification, and an x, y location of the semiconductor device within the reconstituted wafer. The method can further comprise forming a reconstituted wafer by disposing an encapsulant around the plurality of semiconductor die before forming the functional layer.

In another aspect, a method of identifying a unique identity of a semiconductor package can comprise providing a semiconductor die, forming a semiconductor die package for the semiconductor die, and interpreting the unique mark of the semiconductor package to derive the unique identity of the semiconductor die within the package. The semiconductor package can comprise a unique mark within a functional layer of the package.

The a method of identifying a unique identity of a semiconductor package can further comprise the unique identity of the semiconductor die comprising the source wafer identification, and the x, y location of the semiconductor die within the source wafer. The unique mark can provide information for a user to look up the unique identity of the semiconductor die, wherein the information comprises data generated by automatic test equipment, or wafer maps generated by inspection tools during a front end or back-end manufacturing processes. The unique identifying mark can also provide the unique identity of the semiconductor die without requiring a user to look up additional information to determine the unique identity of the semiconductor die. A functional layer of the package can comprise a layer of a build-up interconnect structure formed over the semiconductor die. The method can further comprise optically identifying the unique mark of the semiconductor package, and obtaining information unique to the semiconductor die within the semiconductor package from optically identifying the unique mark. The information conveyed by the unique mark can further comprise a reconstituted wafer or panel identification and an x, y location of the semiconductor device within the reconstituted wafer.

BRIEF DESCRIPTION OF THE DRAWINGS

FIGS. 2A-2F illustrate aspects of a semiconductor package comprising unique identifiers, and a method of making the same.

FIGS. 4A-4C illustrate aspects of a wafer level chip scale semiconductor package (WLCSP) comprising unique identifiers.

DETAILED DESCRIPTION

Figure 1A:
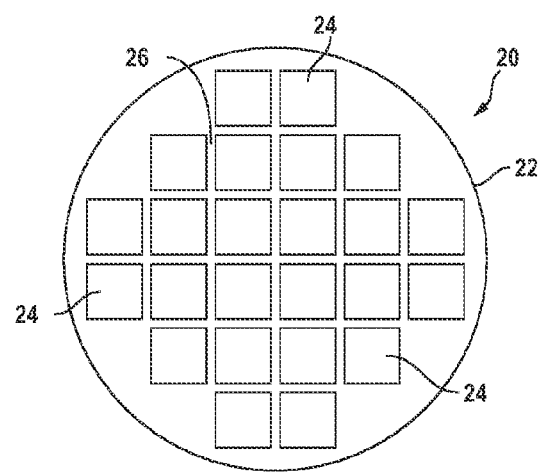
FIGS. 1A-1C illustrate a semiconductor wafer comprising a plurality of semiconductor die.

Embodiments of the disclosure disclose methods and systems to improve semiconductor packaging. This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation. In some instances, well-known processes and manufacturing techniques have not been described in particular detail in order to not unnecessarily obscure the disclosure. Furthermore, the various embodiments shown in the FIGS. are illustrative representations and are not necessarily drawn to scale.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

The terms "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist pattern is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1A shows a semiconductor wafer or native wafer 20 with a base substrate material 22, such as, without limitation, silicon, germanium, gallium arsenide, indium phosphide, or silicon carbide, for structural support. A plurality of semiconductor die or components 24 can be formed on wafer 20 separated by a non-active, inter-die wafer area or saw street 26 as described above. The saw street 26 can provide cutting areas to singulate the semiconductor wafer 20 into the individual semiconductor die 24.

Figure 1B:
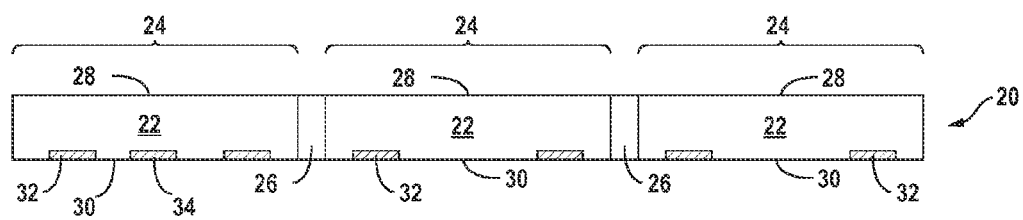

FIG. 1B shows a cross-sectional view of a portion of the semiconductor wafer 20. Each semiconductor die 24 can comprise a backside or back surface 28 and an active surface 30 opposite the backside. The active surface 30 can contain analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface 30 to implement analog circuits or digital circuits, such as DSP, ASIC, memory, or other signal processing circuit. The semiconductor die 24 may also contain integrated passive devices (IPDs), such as inductors, capacitors, and resistors, for RF signal processing or other purposes. In an embodiment, the semiconductor die 24 can comprise a flip-chip type device.

An electrically conductive layer 32 can be formed over the active surface 30 using PVD, CVD, electrolytic plating, electroless plating process, or other suitable metal deposition process. The conductive layer 32 can be one or more layers of Al, Cu, Sn, Ni, Au, Ag, or other suitable electrically conductive material. The conductive layer 32 can operate as contact pads or bond pads electrically connected to the circuits on the active surface 30. The conductive layer 32 can be formed as contact pads disposed side-by-side a first distance from the edge of semiconductor die 24, as shown in FIG. 1B. Alternatively, the conductive layer 32 can be formed as contact pads that are offset in multiple rows such that a first row of contact pads is disposed a first distance from the edge of the die, and a second row of contact pads alternating with the first row is disposed a second distance from the edge of the die.

FIG. 1B also shows an identifying mark or semiconductor die identifying mark 34 formed over, oriented towards, or directly on the active surface or frontside 30 of the semiconductor die 24. Each of the identifying marks 34 can be unique to their respective semiconductor die in order to serve as unique identifying marks. The identifying marks 34 can comprise text, letters, symbols, alphanumeric sequences, alpha-numeric marks, machine-readable 2-dimensional codes, 2-dimensional matrices, bar codes, QR codes, IR codes, or any other identifying mark or image. The unique identifying mark can encode or comprise unique identifying information for a particular semiconductor die, such as the type of product, product capabilities, and product manufacturing information such as the location of the semiconductor die 24 within its native semiconductor wafer 20, the time, date, and location of manufacturing of the semiconductor die 24, or other desirable information. Throughout this disclosure, a number of variations of the identifying mark 34 are discussed, such as identifying marks 34a, 34b, 34c, 34d, and 34e. For convenience, the principles generally applicable to all variations of the identifying marks 34, including the identifying marks 34a, 34b, 34c, 34d, and 34e that are at times collectively discussed or presented as identifying mark 34. As such, the use of identifying mark 34 in place of another identifying marks should in no way be understood to be limiting.

The identifying mark 34 can be formed of, or patterned into, a conductive metal layer or a polymer layer. When formed of a conductive or metal layer, the identifying mark 34 can be formed using PVD, CVD, electrolytic plating, electroless plating process, or other suitable metal deposition process. The identifying mark 34 formed of the conductive layer 32 can comprise one or more layers of Al, Cu, Sn, Ni, Au, Ag, or other suitable material. When formed of a polymer layer, the identifying mark 34 can be formed of any suitable polymer, including a polymer composite material such as epoxy resin with filler, epoxy acrylate with filler, or any suitable filler.

In some embodiments, the conductive layer or polymer layer used for the formation of the identifying mark 34 can be formed at a same time and during a same processing step as another structure or portion of a package or packaging for semiconductor die 24 is being formed. For example, an identifying mark 34 made of metal can be formed at a same time as conductive layer 32. In other instances, the identifying mark 34 can be made as part of another structure, or conductive feature, that is formed on the native semiconductor wafer 20, before singulation of the semiconductor wafer. When the RDL is formed on the semiconductor wafer 20 before singulation, a plurality of identifying marks 34 can also be patterned or formed at a same time that the RDL is formed. Furthermore, the identifying mark 34 for each semiconductor die 24 can be formed at a same time and during a same processing step. As such, a direct write system, a direct write exposure system, or laser can be used to make the identifying marks 34 unique. More specifically, custom light patterns for the unique identifying marks 34 made during the same processing step can allow for the addition of the identifying marks 34 without increasing processing time.

Figure 1C:
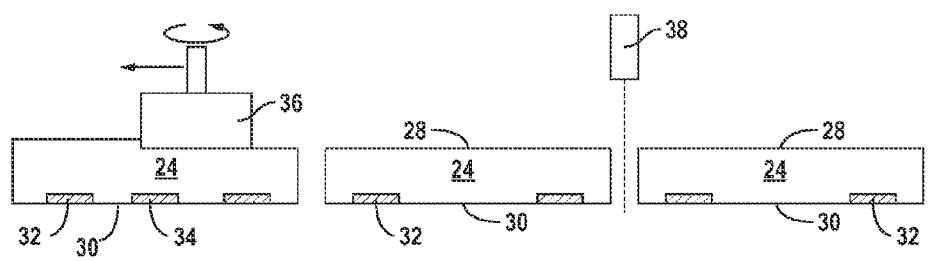

FIG. 1C shows the semiconductor wafer 20 can undergo an optional grinding operation with grinder 36 to planarize the backside or back surface 28 and reduce thickness of the semiconductor wafer 20. A chemical etch can also be used to remove and planarize the semiconductor wafer 20. The semiconductor wafer 20 can also be singulated through saw street 26 using a saw blade or laser cutting tool 38 into individual semiconductor die 24. In some instances, each of the semiconductor die 24 can comprise a unique identifying mark 34 that records source identifying information for each of the semiconductor die 24, such as a position within the semiconductor wafer 20 before singulation. However, semiconductor die 24 with unique identifying marks 34, or general identifying marks will often require another mark or unique identifying marks 34 to identify the semiconductor device or semiconductor package into which the semiconductor die 24 is placed.

In instances when minimal packaging or wafer level packaging (WLP) is employed so that packaging occurs on the native semiconductor wafer 20 and without formation of a reconstituted wafer, unique identifying marks 34a can be used to derive the unique identity of semiconductor die 24 within a completed semiconductor package or semiconductor device 82 by reading, recognizing, scanning, or identifying the a unique identifying mark 34 on or within the package. The unique identity of semiconductor die 24 can include a source wafer ID for the semiconductor wafer 20 and an x, y location of the semiconductor die 24 within the semiconductor wafer 20.

In other instances, a unique identifying mark 34 will not be placed or formed on one or more of the semiconductor die 24 when part of the semiconductor wafer or native wafer 20. Instead, each semiconductor die 24 can have a same mark that identifies the source wafer ID for the semiconductor wafer 20 and not the x, y location of the semiconductor die 24 within the semiconductor wafer 20. Rather, the x, y location of the semiconductor die 24 within the semiconductor wafer 20 will be included in the unique identifying mark 34 that will be included after singulating the individual semiconductor die 24 from the semiconductor wafer 20, and including the singulated semiconductor die 24 within fan-out packages, chip scale packages, or embedded die packages, as described below with respect to FIGS. 2A-F and 3A-3C.

Figure 2A:
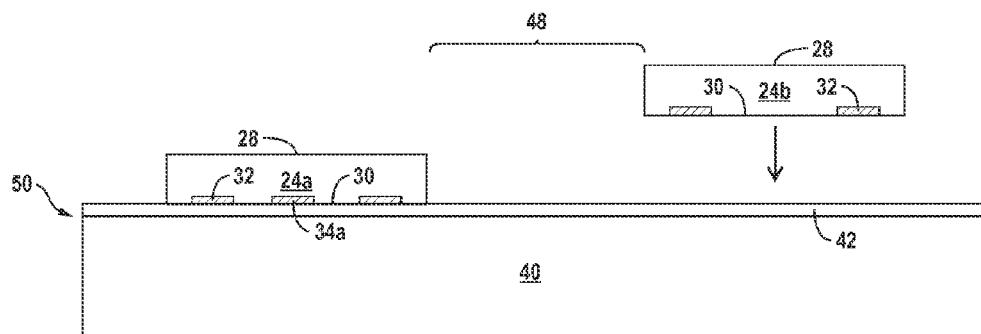

FIG. 2A shows a carrier, substrate, temporary carrier, or temporary substrate 40 containing temporary or sacrificial base material such as silicon, polymer, beryllium oxide, or other suitable low-cost, rigid material for structural support. An optional interface layer or double-sided tape 42 is formed over carrier 40 as a temporary adhesive bonding film or etch-stop layer. Semiconductor die 24 from FIG. 1C can be mounted to carrier 40 and interface layer 42 with active surface 30 oriented towards the substrate. Semiconductor die 24 can be positioned according to a nominal or predetermined position and spacing for the semiconductor die.

Accordingly, FIG. 2A shows a first semiconductor die 24a mounted on or disposed over substrate 40. Similarly, a second semiconductor die 24b is mounted on or disposed over substrate 40.

Figure 2B:
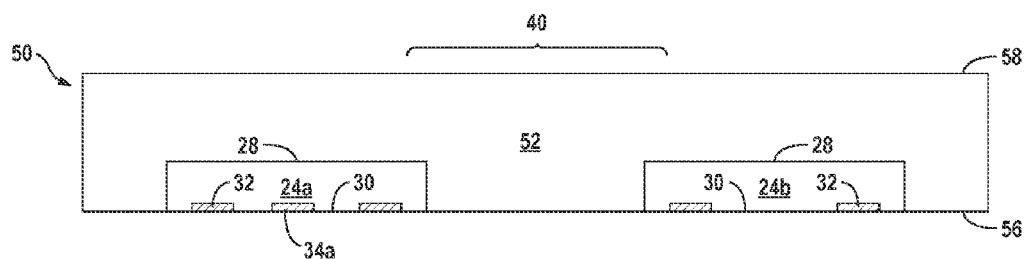

For reconstituted wafers or reconstituted panels 50, shown for example in FIG. 2B, as well as for fan-out packages or embedded die package, the semiconductor die 24 can be placed over carrier 40 using a pick and place machine that can read or obtain a wafer ID number for semiconductor wafer 20, as well as a position or x, y location of the semiconductor die 24 in the semiconductor wafer 20. During placement of the semiconductor die 24, the pick and place machine can, identify, store, or otherwise track through a computer or other system the wafer number and the position of the semiconductor die 24 on the semiconductor wafer 20 as the pick and place machine places the semiconductor die 24 die on carrier 40. The pick and place machine includes or is associated with a processor comprising operating software to control the pick and place machine in identifying, storing and tracking the wafer number and position of the semiconductor die 24 on the semiconductor wafer 20. Local memory associated with the processor stores and maintains the record of respective locations. Those of ordinary skill in the art of pick and place machines will readily understand and know how to configure the pick and place machines for performing these functions from this disclosure.

After being placed on the carrier 40, the semiconductor die 24 can have a new and unique identification number 24 within the reconstituted wafer 50, which can be represented by an identifying mark 34, such as identifying marks 34b-34, as shown and discussed with respect to subsequent FIGS. A database, including electronic and computer data bases can store the positional information of semiconductor 24 for both the semiconductor wafer 20 and the carrier 40 or reconstituted wafer 50, as well as relationships between the positional information, identification, or unique identifying marks of semiconductor 24 for both the semiconductor wafer 20 and the carrier 40 or reconstituted wafer 50 can be retrievably stored.

As such, different types of data can be included, stored, or presented by unique identifying marks 34 in different forms for the viewing, retrieval, and analysis of data for tracing and understanding product failures. In some instances, data included, stored, or presented by the by unique identifying marks 34 could be communicated by a serial number or alpha-numeric sequence that allows a user to look up information in a database. In other instances, data included, stored, or presented by the by unique identifying marks 34 could actually encode all of the data, such as part of a bar code QR code, or other two or three dimensional code. In yet other instances, data included, stored, or presented by the by unique identifying marks 34 could be a combination of techniques involving a user looking up data and encoded data within the mark itself.

Semiconductor die 24 can be separated by space or gap 48 when mounted over substrate 40. Gap 48 can provide an area for a subsequently formed fan-out interconnect structure. A size of gap 48 is determined according to the nominal panel design and provides sufficient space for the fan-out interconnect structure to be formed around each semiconductor die 24. Gap 48 can also include sufficient area for optionally mounting other semiconductor die or semiconductor devices or components such as discrete devices, distributed components, or passive devices including inductors, capacitors, and resistors.

FIG. 2B shows a reconstituted wafer or panel 50 comprising a plurality of semiconductor die 24 from FIG. 2A and an encapsulant or mold compound 52 disposed around the plurality of semiconductor die 24. The encapsulant 52 can be deposited using a paste printing, compressive molding, transfer molding, liquid encapsulant molding, vacuum lamination, film-assisted molding, or other suitable applicator. Encapsulant 52 can be polymer composite material, such as epoxy resin with filler, epoxy acrylate with filler, or polymer with proper filler. Encapsulant 52 can be non-conductive, provide physical support, and environmentally protect the semiconductor device from external elements and contaminants.

The semiconductor die 24 contained within the reconstituted wafer 50 can comprise semiconductor die 24a, semiconductor die 24b, or both. The semiconductor die 24a can be a semiconductor die 24 that comprises an identifying mark 34a that was formed on or with the semiconductor die 24a before the semiconductor die 24a are included within the reconstituted wafer 50, such as an identifying mark 34a that is formed when the semiconductor die 24a is part of the semiconductor wafer 20. The semiconductor die 24b can be a semiconductor die 24 that does not comprise an identifying mark 34 before the semiconductor die 24b is included within the reconstituted wafer 50. However, as discussed in greater detail below, an identifying mark 34 can be added to a semiconductor die 24b, or to a package comprising the semiconductor die 24b, additional semiconductor die, or other electronic devices that can be included within gap 48 as discussed above, after the semiconductor die 24b is included within reconstituted wafer 50.

The encapsulant 52 can contact, cover, and be disposed over or adjacent, the backside 28 of the semiconductor die 24 as well as all of the side surfaces of the semiconductor die that connect or extend between the backside 28 and the frontside 30. A first surface or bottom surface 56 of the reconstituted wafer 50 can comprise a bottom surface of encapsulant 52 that can be coplanar or substantially coplanar with the active surface 30 of the semiconductor die 24. A second surface or top surface 58 of the reconstituted wafer 50 can be disposed opposite the first surface and be disposed over and offset from the backside 28 of the semiconductor die 24. In other embodiments, the second surface 58 of the reconstituted wafer 50 can be coplanar or substantially coplanar with the backside 28 of the semiconductor die 24.

In some embodiments, the encapsulant 52 can be disposed around the semiconductor die 24 while the semiconductor die are mounted, such as face down, to a temporary carrier or substrate that can contain a temporary or sacrificial base material such as silicon, polymer, beryllium oxide, or other suitable low-cost, rigid material for structural support. An optional interface layer or double-sided tape can be disposed over a top surface of the temporary carrier and between the plurality of semiconductor die 24 and the temporary carrier as an adhesive bonding film. The carrier and interface layer can be removed by chemical etching, mechanical peeling, CMP, mechanical grinding, thermal bake, UV light, laser scanning, or wet stripping. FIG. 2B shows a non-limiting example of the reconstituted wafer 50 after removal of the temporary carrier and the interface layer so that bottom surface 56 of the reconstituted wafer 50 is exposed and ready for subsequent processing as described in greater detail below.

Encapsulant 50 can be formed and deposited around the plurality of semiconductor die 24 using a paste printing, compression molding, transfer molding, liquid encapsulant molding, vacuum lamination, spin coating, or other suitable applicator. Encapsulant 50 is evenly dispersed and uniformly distributed under an elevated temperature around semiconductor die 24, and a viscosity of encapsulant 50 can be selected for uniform coverage. Semiconductor die 24 can be embedded together in encapsulant 50, which can be non-conductive and environmentally protect the semiconductor device from external elements and contaminants. The encapsulant 50 disposed around the semiconductor die 24 can form a reconstituted wafer 50 that includes a footprint or form factor of any shape and size that allows for, and facilitates, the subsequent processing required to form the desired semiconductor die packages. As a non-limiting example, the reconstituted wafer 50 can comprise a form factor similar to the form factor of a 300 millimeters (mm) semiconductor wafer and includes a circular footprint having a diameter of 300 mm.

Figure 2C:
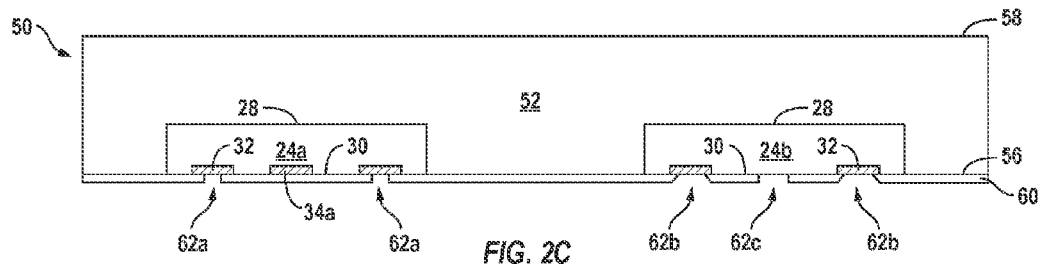

In FIG. 2C, a first portion of a build-up interconnect structure, such as a fan-out build-up interconnect structure, is formed over reconstituted wafer 50 by the deposition and patterning of insulating or passivation layer 60. Insulating layer 60 can be applied to reconstituted wafer 50, such as at bottom surface 56 of the reconstituted wafer 50, either before or after removal of the temporary carrier to which the semiconductor die 24 are mounted. The insulating layer 60 can be conformally applied to, and have a first surface that follows the contours of, the reconstituted wafer 50, including encapsulant 50 and semiconductor die 24. Insulating layer 60 can comprise a second planar surface opposite the first surface. The insulating layer 60 can contain one or more layers of photosensitive low curing temperature dielectric resist, photosensitive composite resist, laminate compound film, insulation paste with filler, solder mask resist film, liquid molding compound, silicon dioxide (SiO2), silicon nitride (Si3N4), silicon oxynitride (SiON), aluminum oxide (Al2O3), or other material having similar insulating and structural properties. The insulating layer 60 can comprise materials that are opaque, translucent, or transparent, to allow for detecting, viewing, or processing optical information stored on an identifying mark 34. Insulating layer 60 can be deposited using printing, spin coating, spray coating, lamination, or other suitable process. Insulating layer 60 can be subsequently patterned and optionally cured to create space for subsequent electrical interconnects, and also to create identifying marks 34. As discussed in greater detail below, the identifying marks 34 can be part of the insulating layer 60 or can be part of an additional material, such as a metal, formed within an opening of the insulating layer 60.

A portion of the insulating layer 60 can be removed by etching, laser drilling, mechanical drilling, or other suitable process to form openings 62. Openings 62 can extend completely through the insulating layer 60 and expose contact pads 32 or any other portion of the semiconductor die 24 or reconstituted wafer 50. Alternatively, openings 62 can extend partially but not completely through the insulating layer 60. As such, in some embodiments a first portion of the openings 62 can extend completely through the insulating layer 60 and a second portion of the openings 62 can extend only partially through the insulating layer 60. FIG. 2C shows a number of different openings 62. Openings 62a and 62b comprise openings for subsequently formed conductive vias and electrical interconnect, respectively. Openings 62c that are formed for subsequently formed identifying marks 34.

Figure 2D:
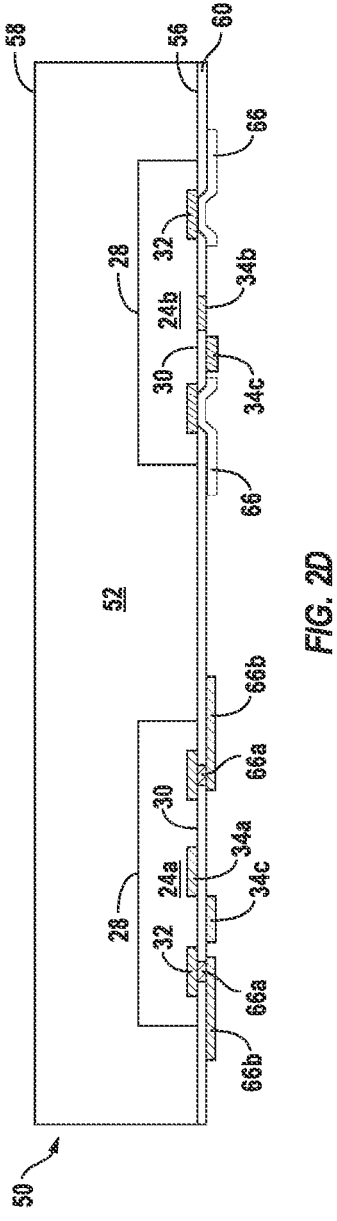

In FIG. 2D, an electrically conductive layer 66 can be deposited in openings 62, including openings 62a and 62b, as well as being deposited over and in electrical contact with contact pads 32, and over and extending across portions of insulating layer 60 to form an RDL. As a non-limiting example, the conductive layer 66 can be deposited using PVD, CVD, electrolytic plating, electroless plating, or other suitable process. The conductive layer 66 can comprise one or more layers of aluminum (Al), copper (Cu), tin (Sn), nickel (Ni), gold (Au), silver (Ag), titanium (Ti), tungsten (W), poly-silicon, or other suitable electrically conductive material.

The conductive layer 66, as shown in FIG. 2D with respect to the semiconductor die 24a, can be formed comprising two different parts or portions, namely a conductive via 66a and an RDL trace 66b. The conductive via 66a can form part of the build-up interconnect structure and provide vertical electrical connection between contact pads 32 and RDL trace 66b. The conductive vias 66a can be formed within openings 62a, which can comprise a size or footprint that can be smaller than the size or footprint of openings 62b. As shown in FIG. 2D, the RDL trace 66b can be conformally applied to the second surface of the insulating layer 60 and to a surface of the conductive via 66a that is co-planar or substantially co-planar with the surface of the conductive via 66a. In some cases the conductive via 66a and the RDL trace 66b can be formed at a same time or during a same processing step, while in other cases the conductive via 66a and the RDL trace 66b can be formed at different times or as part of different processing steps. In either event, the conductive layer 66b can extend across the second surface of the insulating layer 60 and across the conductive via 66a, so that the conductive layer 66b can be oriented parallel or substantially parallel to bottom surface 56 of the reconstituted wafer 50. In instances when the conductive layer 60 is formed as part of a fully molded panel or fully molded package, as shown and discussed with respect to FIGS. 3A-3C, the insulating layer, or its corresponding layer, can be formed as part of the encapsulant 52. See, for example, FIGS. 3A-3C and conductive layer 96.

The conductive layer 66, as shown in FIG. 2D with respect to the semiconductor die 24b, can be formed as an RDL that is conformally applied to the insulating layer 60 and openings 62b. As such, the conductive layer can extend across the second surface of the insulating layer 60 parallel or substantially parallel to bottom surface 56 of the reconstituted wafer 50, and also follow a contour or slope of sidewalls of the openings 62b, as well as extend along a bottom of the openings 62b at an interface, or in contact with, contact pads 32. The conductive layer 66, as shown in FIG. 2D with respect to the semiconductor die 24b, can form part of the build-up interconnect structure 80 that can provide both vertical and horizontal electrical connection with contact pads 32. The portion of conductive layer 66 formed within openings 62b can comprise a size or footprint that is larger than the size or footprint of conductive vias 66a. Alternatively, the portion of conductive layer 66 formed within openings 62b can comprise a size or footprint that is smaller than the size or footprint of conductive vias 66a.

FIG. 2D also shows an identifying mark 34b formed within opening 62c of insulating layer 60. The identifying mark 34b, like each of the identifying marks 34, can be unique to their respective semiconductor die in order to serve as unique identifying marks. However, identifying mark 34b can provide additional benefits than those benefits provided by identifying marks such as identifying mark 34a. Identifying mark 34b, in contrast to identifying marks 34a and other identifying marks 34 that are formed on semiconductor die before inclusion within a reconstituted wafer or semiconductor package, can also include identifying information for a particular semiconductor die package, and not just a particular semiconductor die, such as the type of product packaging, product capabilities, and product packaging manufacturing information, in addition to semiconductor die manufacturing information, such as the location of the semiconductor package within its reconstituted wafer, and the time, date, and location of manufacturing of the semiconductor package, together with other desirable information.

The identifying mark 34b, like other identifying marks 34, can be formed of any suitable mark and of any suitable material, such as metal or polymer. In an embodiment, a portion of the electrically conductive layer 66 can be patterned and deposited as the identifying mark 34b within opening 62c in the insulating layer 60. Alternatively, the identifying mark 34b can be formed as part of a process that is separate from conductive layer 66. As such, the identifying mark 34b can be formed in any of the ways, and with any of the materials or processes described above. In any event, by forming identifying mark 34b at a frontside of a semiconductor die 24, or at a frontside of a semiconductor package comprising the semiconductor die 24, the identifying mark is less likely to be damaged or rendered unreadable during handling of the product or during the product lifetime such as occurred to identifying marks placed on an eternal or exterior surface of a semiconductor die package, such as at a backside of the semiconductor package. Furthermore, identifying marks 34 such as identifying mark 34b can be screen-printed or laser marked on or within a conductive layer such as conductive layer 66, or can be marked on or within an insulating layer such as insulating layer 60. Identifying marks 34 such as identifying mark 34b can also be made using a programmable direct write exposure system. Advantageously, by adding the identifying mark 34 to a conductive layer or insulating layer that is part of the semiconductor package, such as a material layer that would otherwise be part of the semiconductor package, the identifying mark 34 can be added to the semiconductor package without increase processing time or cost. The advantages of decreased time and cost are unavailable for conventional marking on a backside of a semiconductor package or group of packages, that include identifying marks made with lasers or printing.

FIG. 2D also shows that an identifying mark 34c can be formed over, or on and in direct contact with, the second surface of the insulating or passivation layer 60. Identifying mark 34c, like other identifying marks 34, can be formed of any suitable mark and of any suitable material, such as metal or polymer. In an embodiment, a portion of the electrically conductive layer 66 can be patterned and deposited as the identifying mark 34c. Alternatively, the identifying mark 34c can be formed as part of a process that is separate from conductive layer 66. As such, the identifying mark 34c can be formed in any of the ways, and with any of the materials or processes described above to achieve the benefits described herein. In any event, a position, configuration, and design of identifying marks 34 can be arranged or offset with respect to each other to allow the identifying mark to be seen, read, or accessed without being blocked by subsequently added layers or structures. For example, FIG. 2D shows identifying marks 34a and 34c disposed within a footprint of semiconductor die 24a, but offset with respect to each other such that each could be accessed or read. Similarly, FIG. 2D also shows identifying marks 34b and 34c disposed within a footprint of semiconductor die 24b, but offset with respect to each other such that each could be accessed or read. Thus, in some instances more than one identifying mark 34 might be included within a single package. In some embodiments, a first identifying mark, such as identifying mark 34a can be included to identify or communicate information relating to the semiconductor die 24a, while a second identifying mark 24c can be included to identify or communicate information relating to packaging the semiconductor die 24a. In other instances, a single identifying mark 24 will be included that contains all the desired identifying information, and can be positioned or located at any of the positions or locations indicated by any of the various identifying marks 34.

In instances when an identifying mark 34, such as identifying mark 34a, 34b, or 34c, will be covered by additional packaging, such as an insulting layer like insulating layer 60, the insulating layer can comprise a transparent or translucent material. As such, the transparent or translucent material can allow for the identifying marks 34 to be optically recognized and read even when included within the semiconductor package, and while being disposed away from an external or exposed surface of the semiconductor package, like at a backside of the semiconductor die or the semiconductor package.

Figure 2E:
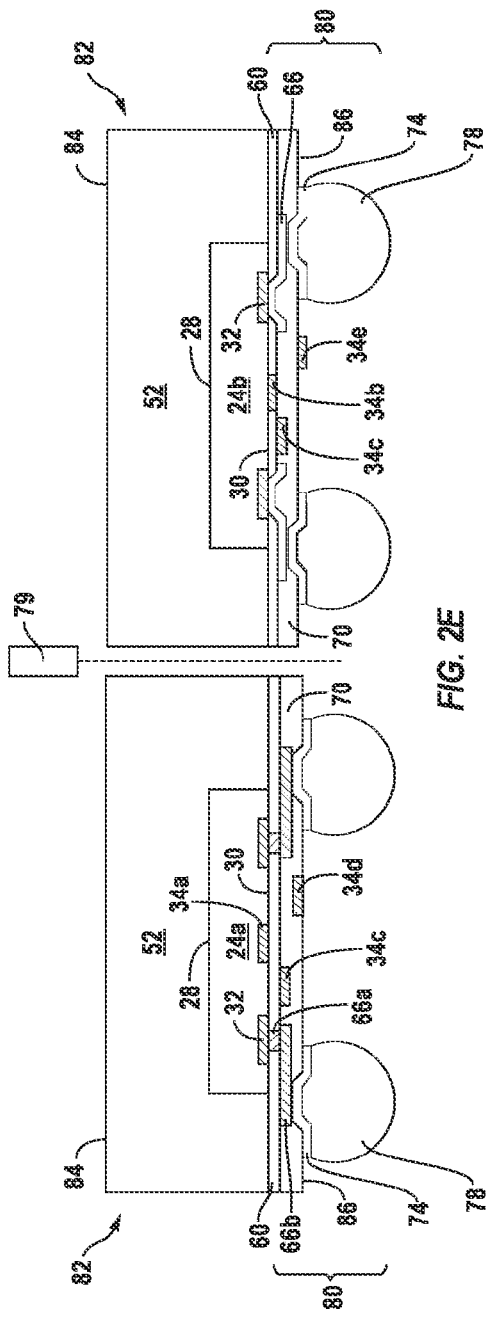

FIG. 2E, continuing from FIG. 2D, shows an insulating or passivation layer 70 that is conformally applied to, and comprises a first surface that follows the contours of, insulating layer 60 and conductive layer 66. Insulating layer 70 further comprises a second planar surface opposite the first surface. Insulating layer 70 can comprise one or more layers of photosensitive low curing temperature dielectric resist, photosensitive composite resist, laminate compound film, insulation paste with filler, solder mask resist film, liquid molding compound, SiO2, Si3N4, SiON, Al2O3, or other material having similar insulating and structural properties. Insulating layer 70 can be deposited using printing, spin coating, spray coating, lamination, or other suitable process. Insulating layer 70, like insulating layer 60, can also comprise a transparent or translucent material to allow for optical recognition of identifying marks 34 through the insulating material. Insulating layer 70 can also be subsequently patterned and optionally cured.

A portion of insulating layer 70 can be removed by etching, laser drilling, mechanical drilling, or other suitable process to form openings that extend partially or completely through insulating layer 70. Openings that extend partially through the insulating layer 70 can be used for the formation of identifying marks 34d, which can be disposed partially or completely within the insulating layer 70. In other instances, identifying marks 34e can be formed over the insulating layer 70 without being partially or completely disposed within the insulating layer 70. When more than one conductive layer 66, RDL trace 66b, or other routing layer and corresponding insulating layers are used as part of build-up interconnect structure or functional layer 80, other positions over, under, or in the various layers of the build-up interconnect structure 80 can also be used for identifying marks 34.

Openings that extend completely through the insulating layer 70 and expose a portion of conductive layer 66 can be used for electrical inputs/outputs (i/o) for the semiconductor die 24. An electrically conductive layer can be deposited in the openings in insulating layer 70 and in contact with conductive layer 66 using PVD, CVD, electrolytic plating, electroless plating, or other suitable process to form under bump metallization (UBM) pads 74. UBM pads 74 can be multiple metal stacks including adhesion, barrier, seed, and wetting layers. Layers of UBM 74 can be Ti, titanium nitride (TiN), titanium tungsten (TiW), Al, Cu, chromium (Cr), chromium copper (CrCu), Ni, nickel vanadium (NiV), palladium (Pd), platinum (Pt), Au, and Ag. As a non-limiting example, UBM pads 74 can comprise a TiW seed layer, a Cu Seed layer, and a Cu UBM layer. The TiW seed layer can be conformally applied over insulating layer 70 and conductive layer 66. The Cu seed layer can be conformally applied over the TiW seed layer. The Cu UBM layer can be conformally applied over the TiW seed layer and the Cu seed layer. UBM pads 74 act as an intermediate conductive layer between conductive layer 66 and subsequently formed solder bumps or other I/O interconnect structures. UBM pads 74 can provide a low resistive interconnect to conductive layer 66, a barrier to solder diffusion, and an increase in solder wettability.

An electrically conductive bump material can be deposited over UBM pads 74 and conductive layer 66 using an evaporation, electrolytic plating, electroless plating, ball drop, screen printing, or other suitable process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material can be bonded to UBM pads 74 using a suitable attachment or bonding process. In an embodiment, the bump material can be reflowed by heating the material above its melting point to form spherical balls or bumps 78. In some applications, bumps 78 are reflowed a second time to improve electrical contact to UBM pads 74. The bumps can also be compression bonded to UBM pads 74. Bumps 78 represent one type of interconnect structure that can be formed over UBM pads 74. The interconnect structure can also comprise conductive paste, stud bump, micro bump, or other electrical interconnect. Taken together, the insulating or passivation layer 60, the conductive layer 66, the insulating or passivation layer 70, the UBM pads 74, and the bumps 78 can form build-up interconnect structure or functional layer 80 that provides for electrical connection and distribution of electrical signals throughout the semiconductor package 82 according to the configuration and design of the semiconductor package. As such, the build-up interconnect structure 80 is not limited to the specific number or type of layers that have been included as non-limiting examples, but can additionally comprise more layers or fewer layers to provide the desired interconnection.

The formation of build-up interconnect structure 80 and identifying marks 34 can be formed using a maskless or mask-less patterning system, such as a laser, direct write imaging system, maskless lithography, or other maskless patterning system, such as that disclosed in U.S. patent application Ser. No. 13/891,006, the entirety of the contents of which are incorporated by this reference.

FIG. 2E also shows that after the formation of bumps 78, reconstituted wafer 50 can be singulated using a saw blade or laser cutting tool 80 to form semiconductor packages 82. The semiconductor package 82 can comprise a backside or first surface 84 that is disposed over the backside 28 of the semiconductor die 24. The semiconductor package 82 can also comprise a frontside or second surface 86 that is disposed over the active surface 30 of the semiconductor die 24.

FIG. 2F shows a plan view of a semiconductor package 82 directed towards the frontside 86 of the semiconductor package 82. As such, FIG. 2F shows the semiconductor die 24 encased with the encapsulant 52 and electrically connected with the build-up interconnect structure 80, which can include conductive layer 66, conductive vias 66a, RDL traces 66b, and bumps 78. FIG. 2F also shows an identifying mark 34 included adjacent the active surface 30 of the semiconductor die 24 or within the build-up interconnect structure 80. The identifying mark 34 can be at an external or exterior surface of the semiconductor package 82 to be visible and readable by optical inspection for communication of the information stored, linked, or presented by the identifying mark 34. Alternatively, the identifying mark 34 can be positioned away from an external or exterior surface of the semiconductor package 82 and embedded within the semiconductor package 82, such as within the build-up interconnect structure 80. When the identifying mark 34 is embedded within the semiconductor package 82, the additional layers or materials disposed over the identifying mark 34 can be translucent or transparent to allow for the identifying mark to be visible and readable by optical inspection for communication of the information stored, linked, or presented by the identifying mark 34.

Thus, by forming the identifying mark 34 as described herein, the identifying mark 34 is not positioned at the backside 84 of the semiconductor package 82 as with conventional packages. Conventional identifying marks or identifiers that are screen-printed or laser marked at a backside of a product, such as a semiconductor package or semiconductor die, can be exposed to damage during handling or throughout product lifetime. To the contrary, the identifying mark 34 is not exposed at an exterior of the semiconductor package, and as such is not exposed to damage during handling or routine use throughout the lifetime of the semiconductor package 82.

Furthermore, the identifying mark 34 is not subject to the additional processing time required for uniquely identifying individual packages marked by screen-printing or laser marking on the backside of the package in a separate or time-intensive process. Instead of conventional time intensive processes for product marking, the identifying mark 34 can be made by using a programmable direct write exposure system to pattern a plurality of the unique identifying marks 34 at the wafer level, such as on reconstituted wafer 50, simultaneously or at a same time, rather than waiting for printing or laser scribing to occur for each package serially.

As indicated above, the formation of the identifying mark 34 can be with, or at a same time as, formation or patterning of a conductive, metal, insulating, or polymer layer that would be otherwise included within the semiconductor package 82, thereby allowing for product marking or identifying of the semiconductor packages 82 with little or no increase in time or cost of processing. Thus, formation of an entire mark at a same time, as well as a formation of a plurality of marks at a same time, is not limited to raster type formation of marks, or of multiple marks, such as a laser or printer inscribing marks during one or more passes, such as a left to right passes, across a strip or wafer comprising a plurality of packages or semiconductor die. Instead, an entire mark, or a plurality of marks can be formed at a same time without rastering, such as by one or more of patterning, developing, forming, and depositing a material.

In addition to reducing cost on an individual per package basis, the use of front-side package-level serialization for inclusion of identifying marks with existing package layers can also increase a company's ability to perform detailed failure analysis at a package level. Front-side package-level serialization within existing package layers can improve yields through packaging and testing, tie back-end test results to fab processing, and isolate problems that occur when the product is in the field. The detailed failure analysis at the package level can allow for identification of problems that can be eliminated to improve design and reduce future problems, thereby reducing cost on a product level rather than on a per package level.

Similar to the discussion above with respect to FIGS. 1A-2F, FIGS. 3A-3C shows another embodiment of front-side package-level serialization of unique identifying marks 98, which are the same or similar to unique identifying marks 34 discussed above.

Figure 3A:
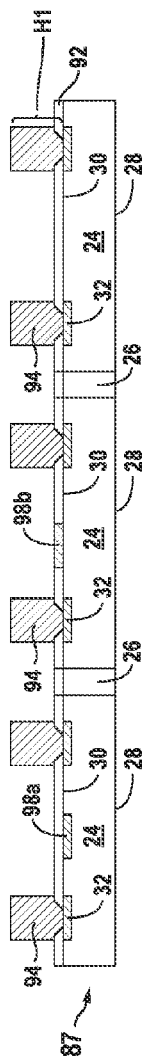
FIGS. 3A-3C also illustrate aspects of a fan-out semiconductor package comprising unique identifiers.

FIG. 3A shows a semiconductor wafer or native wafer 87 comprising a plurality of semiconductor die 24. The semiconductor wafer 87 differs from semiconductor wafer 20 by the inclusion, or addition, of conductive pillars, posts, columns, interconnects, or vias 94. An optional insulating layer 92 can be disposed over the active surface 30 of the semiconductor die 32 before the conductive pillars 94 are formed over, coupled to, or in direct contact with, contact pads 32. The insulating layer 92 can be conformally applied to, and have a first surface that follows the contours of, the semiconductor die 24, including the semiconductor die 24 and the contact pads 32. The insulating layer 92 can comprise a second planar surface opposite the first surface. The insulating layer 92 can contain one or more layers of photosensitive low curing temperature dielectric resist, photosensitive composite resist, laminate compound film, insulation paste with filler, solder mask resist film, liquid molding compound, $SiO_2$, $Si_3N_4$, SiON, $Al_2O_3$, or other material having similar insulating and structural properties. In some instances, the insulating layer 92 can be formed as a polymer. The insulating layer 90 can comprise materials that are opaque, translucent, or transparent, to allow for detecting, viewing, or processing optical information stored on an identifying mark formed on, at, or near the active surface 30 of the semiconductor die 24, similar to what is shown in FIG. 2C. The insulating layer 92 can be deposited using printing, spin coating, spray coating, lamination, or other suitable process. The insulating layer 92 can be subsequently patterned and optionally cured to create space for subsequent electrical interconnects, and also to create, or create space for, identifying marks similar to identifying marks 34.

A portion of the insulating layer 92 can be removed by etching, laser drilling, mechanical drilling, or other suitable process to form openings that can extend partially or completely through the insulating layer 92 and expose contact pads 32 or any other portion of the semiconductor die 24. In some instances, openings in the insulating layer 92 over contact pads 32, and conductive pillars 94, can be formed over the contact pads 32 while the semiconductor die 24 are unsingulated, or part of, a native wafer such as semiconductor wafer 20.

The conductive pillars 94 can be formed over, and connected to, contact pads 32. The conductive pillars 94 can be formed directly on the contact pads 32 using patterning and metal deposition processes such as printing, PVD, CVD, sputtering, electrolytic plating, electroless plating, metal evaporation, metal sputtering, or other suitable metal deposition process. The conductive pillars 94 can be one or more layers of Al, Cu, Sn, Ni, Au, Ag, or other suitable electrically conductive material. In an embodiment, a photoresist layer is deposited over semiconductor die 24 and conductive layer 32. A portion of the photoresist layer can be exposed and removed by an etching development process. The conductive pillars 94 can be formed as copper pillars, posts, or columns in the removed portion of the photoresist and over contact pads 32 using a selective plating process. The photoresist layer can be removed, leaving the conductive pillars 94 to provide for subsequent electrical interconnection and a standoff with respect to active surface 30 of the semiconductor die 24. In some embodiments, the conductive pillars 94 can include a height H1 in a range of 10-40 micrometers (μm), 15-25 μm, or a height of about 20 μm.

Figure 3B:
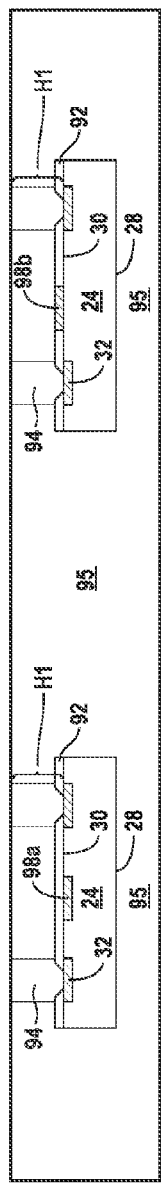

FIG. 3B shows that after the formation of the conductive pillars 94, an encapsulant 95, similar or identical to the encapsulant 52, can be disposed, formed around, or placed in contact with the semiconductor die 24, including at the frontside 30 of the semiconductor die, and around the pillars 94. In some instances, the semiconductor die 24 can be singulated, placed over a temporary carrier or temporary substrate, to form a reconstituted wafer or reconstituted panel 88 in which the encapsulant 95 can be disposed, formed around, or placed in contact with the backside 28 of the semiconductor die 24 as well as all of the side surfaces of the semiconductor die 24 that connect or extend between the backside 28 and the frontside 30. In some embodiments, the encapsulant 95 can be disposed around the semiconductor die 24 while the semiconductor die are mounted face down to the temporary carrier or substrate. Alternatively, and as discussed in greater detail with respect to FIGS. 4A-4B, encapsulant can be placed over the semiconductor die 24 and around the pillars 94 while the semiconductor die 24 are part of, and remain unsingulated from, the semiconductor wafer 87, such as for the formation of WLPs or wafer level chip scale packages (WLCSPs).

Figure 3C:
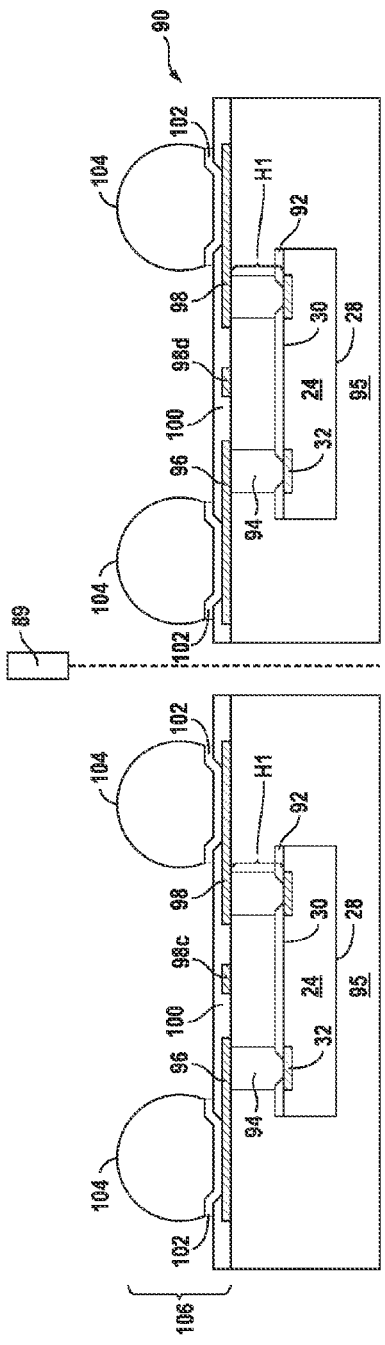

As shown in FIG. 3C, after the formation or disposal of the encapsulant 95 around the semiconductor die 24 and the conductive pillars 94, a conductive layer 96, similar to the conductive layer 66, can be formed over the conductive pillar 94 and extend across a surface of the encapsulant 95. The conductive layer 96 can be one or more layers of Al, Cu, Sn, Ni, Au, Ag, or other suitable electrically conductive material. The formation of the conductive layer 96 can use PVD, CVD, electrolytic plating, electroless plating, or other suitable process. In an embodiment, the conductive layer 96 can be an RDL comprising a TiW seed layer, a Cu seed layer, and Cu layer formed over the TiW seed layer and the Cu seed layer. The conductive layer 96 can provide electrical interconnection between the conductive pillars 94 and UBMs 102 and bumps 104.

An identifying mark 98 similar to one or more of the identifying mark 34 described above can be formed over, or on and in direct contact with, the active surface 30 of the semiconductor die 24, the insulating layer 92, the encapsulant 95, or the insulating layer 100. The identifying mark 98, like other identifying marks 34, can be formed of any suitable mark and of any suitable material, such as metal or polymer. In an embodiment, a portion of the electrically conductive layer 96 can be patterned and deposited as the identifying mark 98. Alternatively, the identifying mark 98 can be formed as part of a process that is separate from conductive layer 96. As such, the identifying mark 98 can be formed in any of the ways, and with any of the materials or processes described above to achieve the benefits described herein. In instances when an identifying mark 98 will be covered by additional packaging, such as an insulting layer like insulating layer 100, the insulating layer can comprise a transparent or translucent material. As such, the transparent or translucent material can allow for the identifying marks 98 to be optically recognized and read even when included within the semiconductor package, and while being disposed away from an external or exposed surface of the semiconductor package.

FIG. 3C shows that an insulating or passivation layer 100 that can be conformally applied to, and comprises a first surface that follows the contours of, encapsulant 95 and conductive layer 96. Insulating layer 70 can further comprise a second planar surface opposite the first surface. Insulating layer 70 can comprise one or more layers of photosensitive low curing temperature dielectric resist, photosensitive composite resist, laminate compound film, insulation paste with filler, solder mask resist film, liquid molding compound, $SiO_2$, $Si_3N_4$, SiON, $Al_2O_3$, or other material having similar insulating and structural properties. Insulating layer 70 can be deposited using printing, spin coating, spray coating, lamination, or other suitable process. Insulating layer 100, like insulating layer 70, can also comprise a transparent or translucent material to allow for optical recognition of identifying marks 98 through the insulating material. The insulating layer 100 can also be subsequently patterned and optionally cured.

A portion of insulating layer 100 can be removed by etching, laser drilling, mechanical drilling, or other suitable process to form openings that extend completely through insulating layer 100 and expose a portion of the conductive layer 96. An electrically conductive layer can be deposited in the openings in the insulating layer 100, and in contact with the conductive layer 96, using PVD, CVD, electrolytic plating, electroless plating, or other suitable process to form under bump metallization (UBM) pads 102. UBM pads 74 can be multiple metal stacks including adhesion, barrier, seed, and wetting layers. Layers of the UBM 102 can be Ti, TiN, TiW, Al, Cu, Cr, CrCu, Ni, NiV, Pd, Pt, Au, and Ag. As a non-limiting example, UBM pads 102 can comprise a TiW seed layer, a Cu Seed layer, and a Cu UBM layer. The TiW seed layer can be conformally applied over the insulating layer 100 and the conductive layer 96. The Cu seed layer can be conformally applied over the TiW seed layer. The Cu UBM layer can be conformally applied over the TiW seed layer and the Cu seed layer. The UBM pads 102 can act as an intermediate conductive layer between conductive layer 96 and subsequently formed solder bumps or other I/O interconnect structures. UBM pads 102 can provide a low resistive interconnect to conductive layer 96, a barrier to solder diffusion, and an increase in solder wettability.

An electrically conductive bump material can be deposited over UBM pads 102 and conductive layer 96 using an evaporation, electrolytic plating, electroless plating, ball drop, screen printing, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to UBM pads 102 using a suitable attachment or bonding process. In an embodiment, the bump material can be reflowed by heating the material above its melting point to form spherical balls or bumps 104. In some applications, bumps 104 are reflowed a second time to improve electrical contact to UBM pads 102. The bumps can also be compression bonded to UBM pads 102. Bumps 104 represent one type of interconnect structure that can be formed over UBM pads 102. The interconnect structure can also comprise conductive paste, stud bump, micro bump, or other electrical interconnect. Taken together, the insulating or passivation layer 100, the conductive layer 96, the insulating or passivation layer 100, the UBM pads 102, and the bumps 104 can form build-up interconnect structure 106 that provides for electrical connection and distribution of electrical signals throughout the semiconductor package 90 according to the configuration and design of the semiconductor package. As such, the build-up interconnect structure 106 is not limited to the specific number or type of layers that have been included as non-limiting examples, but can additionally comprise more layers or fewer layers to provide the desired interconnection.

FIG. 3C shows the reconstituted wafer of panel 88 can be singulated with saw blade or laser cutting tool 89 to form individual semiconductor packages 90, which can differ from the semiconductor packages 82 by the inclusion of conductive pillars 94 and the optional insulating layer 92.

Thus, by forming the identifying mark 98 as part of the semiconductor package, similar or identical advantages to those provided by the identifying mark 34 in the semiconductor packages 82 can be achieved. More specifically, by forming the identifying mark 98 as described herein, the identifying mark 98 is not positioned at the backside of the semiconductor package 90 as with conventional packages. Conventional identifying marks or identifiers that are screen-printed or laser marked at a backside of a product, such as a semiconductor package or semiconductor die, can be exposed to damage during handling or throughout product lifetime. To the contrary, the identifying mark 98 is not exposed at an exterior of the semiconductor package, and as such is not exposed to damage during handling or routine use throughout the lifetime of the semiconductor package 90. Furthermore, the identifying mark 98 is not subject to the additional processing time required for uniquely identifying individual packages marked by screen-printing or laser marking on the backside of the package in a separate or time-intensive process. Instead of conventional time intensive processes for product marking, the identifying mark 98 can be made by using a programmable direct write exposure system to pattern a plurality of the unique identifying marks 98 at the wafer level, such as on reconstituted wafer, simultaneously or at a same time, rather than waiting for printing or laser scribing to occur for each package serially.

As indicated above, the formation of the identifying mark 98 can be with, or at a same time as, formation or patterning of a conductive, metal, insulating, or polymer layer that would be otherwise included within the semiconductor package 90, thereby allowing for product marking or identifying of the semiconductor packages 90 with little or no increase in time or cost of processing. Thus, formation of an entire mark at a same time, as well as a formation of a plurality of marks at a same time, is not limited to raster type formation of marks, or of multiple marks, such as a laser or printer inscribing marks during one or more passes, such as a left to right passes, across a strip or wafer comprising a plurality of packages or semiconductor die. Instead, an entire mark, or a plurality of marks can be formed at a same time without rastering, such as by one or more of patterning, developing, forming, and depositing a material. In addition to reducing cost on an individual per package basis, the use of front-side package-level serialization for inclusion of identifying marks with existing package layers can also increase a company's ability to perform detailed failure analysis at a package level. Front-side package-level serialization within existing package layers can improve yields through packaging and testing, tie back-end test results to fab processing, and isolate problems that occur when the product is in the field. The detailed failure analysis at the package level can allow for identification of problems that can be eliminated to improve design and reduce future problems, thereby reducing cost on a product level rather than on a per package level.

Furthermore, detailed failure analysis of semiconductor packages, such as semiconductor packages 82 and semiconductor packages 90, can be enabled by full traceability of the semiconductor die 24 as well as the processing of the packaging for the semiconductor die. Full traceability can include identification of the front-end and back-end manufacturing lot numbers, and time and place of manufacture. Conventionally, full traceability has often been difficult to provide due to limitations in methods and of marking semiconductor units. However, improved marking as described herein with respect to information about the origin, position, and identification of the semiconductor die 24 within semiconductor wafer 20, reconstituted wafers 50, semiconductor package 82, semiconductor wafer or native wafer 87, reconstituted wafer or reconstituted panel 88, and semiconductor package 90 allows for improved traceability, and more efficient and effective ways for providing full traceability, without the time and cost prohibitions conventionally experienced.

FIG. 4A, continuing from FIG. 3A, shows that after the formation of the conductive pillars 94, an encapsulant 115, similar or identical to the encapsulant 52 or 85, can be disposed, formed around, or placed in contact with the semiconductor die 24, including at the frontside 30 of the semiconductor die, and around the pillars 94 while the semiconductor die 24 are part of, and remain unsingulated from, the semiconductor wafer 87, such as for the formation of WLPs or WLCSPs.

FIG. 4B, continuing from FIG. 4A, shows that after the formation or disposal of the encapsulant 95 around the semiconductor die 24 and the conductive pillars 94, a conductive layer 116, similar to the conductive layer 66 or 96, can be formed over the conductive pillar 94 and extend across a surface of the encapsulant 115. The conductive layer 116 can be one or more layers of Al, Cu, Sn, Ni, Au, Ag, or other suitable electrically conductive material. The formation of the conductive layer 96 can use PVD, CVD, electrolytic plating, electroless plating, or other suitable process. In an embodiment, the conductive layer 96 can be an RDL comprising a TiW seed layer, a Cu seed layer, and Cu layer formed over the TiW seed layer and the Cu seed layer. The conductive layer 96 can provide electrical interconnection between the conductive pillars 94 and UBMs 102 and bumps 104.

An identifying mark or unique identifying mark 118 similar to one or more of the identifying mark 34 or 98 described above can be formed over, or on and in direct contact with the encapsulant 115 or the insulating layer 120. The identifying mark 118, like other identifying marks 34, can be formed of any suitable mark and of any suitable material, such as metal or polymer. In an embodiment, a portion of the electrically conductive layer 116 can be patterned and deposited as the identifying mark 118. Alternatively, the identifying mark 118 can be formed as part of a process that is separate from conductive layer 116. As such, the identifying mark 118 can be formed in any of the ways, and with any of the materials or processes described above to achieve the benefits described herein. In instances when an identifying mark 118 will be covered by additional packaging, such as an insulting layer like insulating layer 120, the insulating layer can comprise a transparent or translucent material. As such, the transparent or translucent material can allow for the identifying marks 118 to be optically recognized and read even when included within the semiconductor package, and while being disposed away from an external or exposed surface of the semiconductor package.

FIG. 4B also shows that the insulating or passivation layer 120 can be conformally applied to, and comprise a first surface that follows the contours of, encapsulant 115, conductive layer 116, and one or more identifying marks 118.

Insulating layer 120 can include one or more insulating or passivation layers, at least one of which can comprise a second planar surface opposite the first surface. Insulating layer 120 can comprise one or more layers of photosensitive low curing temperature dielectric resist, photosensitive composite resist, laminate compound film, insulation paste with filler, solder mask resist film, liquid molding compound, SiO2, Si3N4, SiON, Al2O3, or other material having similar insulating and structural properties. Insulating layer 120 can be deposited using printing, spin coating, spray coating, lamination, or other suitable process. Insulating layer 120, like insulating layer 70 or insulating layer 100, can also comprise a transparent or translucent material to allow for optical recognition of identification of identifying marks 118 through the insulating material 120. The insulating layer 120 can also be subsequently patterned and optionally cured.

A portion of insulating layer 120 can be removed by etching, laser drilling, mechanical drilling, or other suitable process to form openings that extend completely through insulating layer 120 and expose a portion of the conductive layer 116. An electrically conductive layer can be deposited in the openings in the insulating layer 100, and in contact with the conductive layer 116, using PVD, CVD, electrolytic plating, electroless plating, or other suitable process to form under bump metallization (UBM) pads 122. UBM pads 122 can be multiple metal stacks including adhesion, barrier, seed, and wetting layers. Layers of the UBM 122 can be Ti, TiN, TiW, Al, Cu, Cr, CrCu, Ni, NiV, Pd, Pt, Au, and Ag. As a non-limiting example, UBM pads 122 can comprise a TiW seed layer, a Cu Seed layer, and a Cu UBM layer. The TiW seed layer can be conformally applied over the insulating layer 120 and the conductive layer 116. The Cu seed layer can be conformally applied over the TiW seed layer. The Cu UBM layer can be conformally applied over the TiW seed layer and the Cu seed layer. The UBM pads 122 can act as an intermediate conductive layer between conductive layer 116 or conductive pillars 94 and subsequently formed solder bumps or other I/O interconnect structures. UBM pads 122 can provide a low resistive interconnect to conductive layer 6, a barrier to solder diffusion, and an increase in solder wettability.

An electrically conductive bump material can be deposited over UBM pads 122 and conductive layer 116 using an evaporation, electrolytic plating, electroless plating, ball drop, screen printing, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to UBM pads 122 using a suitable attachment or bonding process. In an embodiment, the bump material can be reflowed by heating the material above its melting point to form spherical balls or bumps 124. In some applications, bumps 124 are reflowed a second time to improve electrical contact to UBM pads 122. The bumps can also be compression bonded to UBM pads 122. Bumps 124 represent one type of interconnect structure that can be formed over UBM pads 122. The interconnect structure can also comprise conductive paste, stud bump, micro bump, or other electrical interconnect. Taken together, the conductive layer 116, the identifying mark 118, the insulating or passivation layer 120, the UBM pads 122, and the bumps 124 can form, or be included within, build-up interconnect structure 126 to provide electrical connection and distribution of electrical signals throughout the semiconductor package 110 according to the configuration and design of the semiconductor package. As such, the build-up interconnect structure 126 is not limited to the specific number or type of layers that have been included as non-limiting examples, but can additionally comprise more layers or fewer layers to provide the desired interconnection.

FIG. 4B shows the wafer or panel 112 can be singulated with saw blade or laser cutting tool 89 to form individual semiconductor packages 110. Semiconductor packages 110 can differ from the semiconductor packages 82 by the inclusion of conductive pillars 94 and the optional insulating layer 92. Semiconductor packages 110 can differ from the semiconductor packages 90 by being formed as WLCSPs instead of fan-out WLCSPs. Thus, by forming the identifying mark 98 as part of the semiconductor package, advantages similar or identical to the advantages provided by the identifying mark 34 in the semiconductor packages 82 and the identifying mark 98 in semiconductor package 90 can also be provided.

FIG. 4C shows a semiconductor package or WLCSP 130 being singulated from a wafer of panel 132 by saw blade or laser cutting tool 89. Semiconductor package or WLCSP 130 differs from semiconductor package or fan-out WLP 82 from FIG. 2E by being formed over native wafer 20, before singulation of semiconductor die 24, rather than by being formed as a fan-out WLP from reconstituted wafer or reconstituted panel 50. Semiconductor package or WLCSP 130 differs from semiconductor package or WLCSP 110, shown in FIG. 4B, by the omission of conductive pillars 94. Otherwise, the semiconductor package 130 can be formed with the same or similar features, layers, structures, or elements of the semiconductor package 110 using the same or similar processes, methods, or steps. As shown, the semiconductor package 130 can comprise, encapsulant 115, conductive layer 116, identifying mark or unique identifying mark 118, insulating layer 120, UBMs or UBM pads 122, bumps 124, and build-up interconnect structures 126. Thus, by forming the identifying mark 118 as part of the semiconductor package 130, advantages similar or identical to the advantages provided by the identifying mark 34 in the semiconductor packages 82, the identifying mark 98 in semiconductor package 90, and identifying marks 118 in semiconductor packages 110 can also be provided.

Figure 5A:
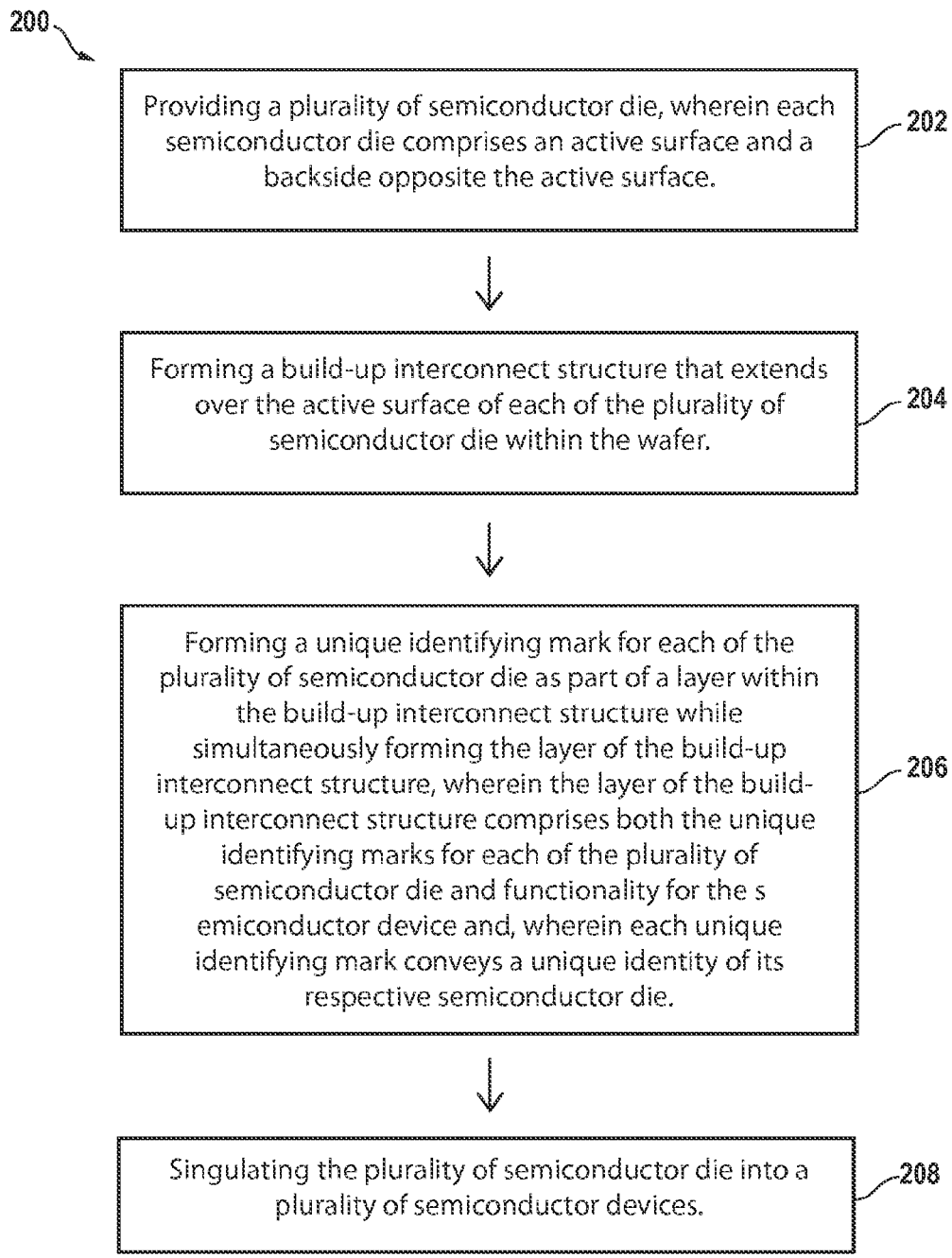
FIGS. 5A and 5B illustrate flow charts for systems or methods of making and identifying semiconductor die packages.

FIG. 5A is a flow chart of a system or method 200 for making a semiconductor device. The method can comprise providing a plurality of semiconductor die, wherein each semiconductor die comprises an active surface and a backside opposite the active surface, as shown at box 202. The method can further comprise forming a build-up interconnect structure that extends over the active surface of each of the plurality of semiconductor die within the wafer, as shown at box 204. The method can further comprise forming a unique identifying mark for each of the plurality of semiconductor die as part of a layer within the build-up interconnect structure while simultaneously forming the layer of the build-up interconnect structure, wherein the layer of the build-up interconnect structure comprises both the unique identifying marks for each of the plurality of semiconductor die and functionality for the semiconductor device and, wherein each unique identifying mark conveys a unique identity of its respective semiconductor die, as shown at box 206. The method can further comprise singulating the plurality of semiconductor die into a plurality of semiconductor devices, as shown at box 208.

Figure 5B:
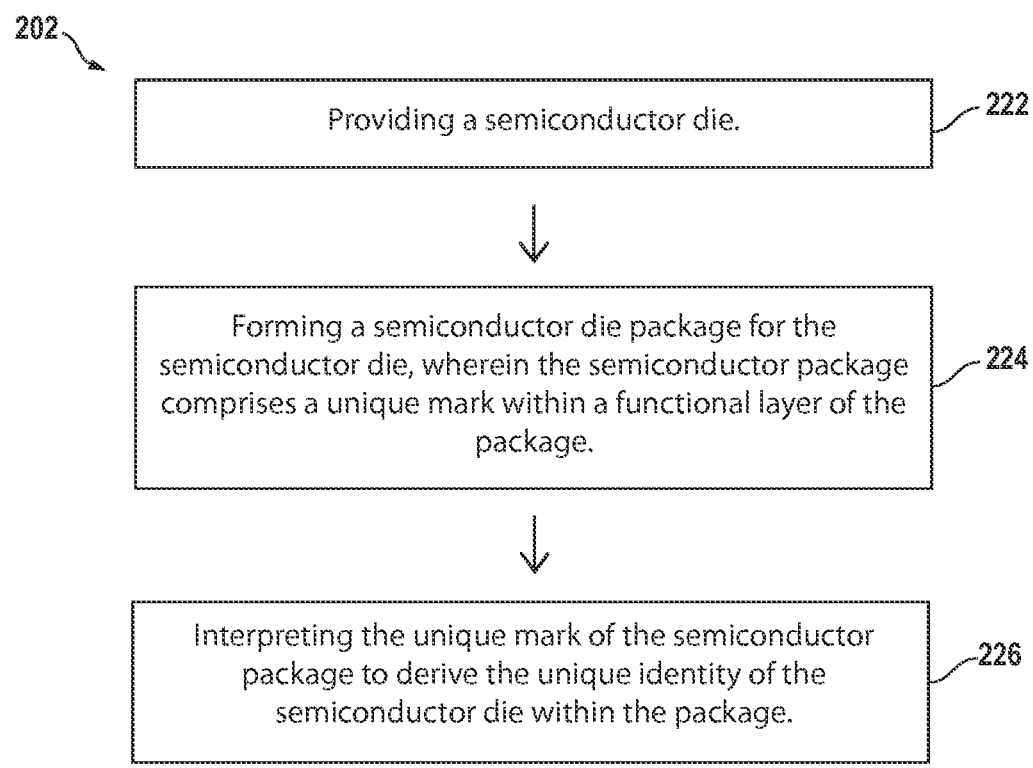

FIG. 5B is a flow chart of a system or method 220 of identifying a unique identity of a semiconductor package. The method can comprise providing a semiconductor die, as shown at box 222. The method can further comprise forming a semiconductor die package for the semiconductor die, wherein the semiconductor package comprises a unique mark within a functional layer of the package, as shown at box 24. The method can further comprise interpreting the unique mark of the semiconductor package to derive the unique identity of the semiconductor die within the package, as shown at box 226.

The forming, identifying, storing and other parts of this method are described in other various parts of the present application. Interpreting the unique mark may be performed with a processor running operating software configured to derive the unique identity of the semiconductor die within each package. The processor may be associated with a unique mark reader, such as an optical or other code reader appropriate to read the code used to create the unique mark, and with a database of unique marks to cross-reference the unique mark with the particular unique identity of the semiconductor dies used in the various packages so that the unique identity of the semiconductor die included within a particular package may be found.

In particular embodiments, the unique identity of the semiconductor die may include the source wafer identification and the x, y location of the semiconductor die within the source wafer. In some embodiments, the unique mark may include information that the user can look up the unique identity of the semiconductor die, wherein the information is generated by automatic test equipment or wafer maps generated by inspection tools during the front end or back-end manufacturing processes. In other embodiments, the unique mark includes the unique identity of the semiconductor die within the mark itself so that a user does not need to look up any additional information to determine the unique identity of the semiconductor die. Where the mark itself includes the unique identity of the semiconductor die, the user may optically identify the unique mark of the semiconductor package and obtain information unique to the semiconductor die within the semiconductor package from the unique mark that is optically identified. The unique mark may be included within a functional layer of the package comprising a layer of build-up interconnect structure formed over the semiconductor die.

In the foregoing specification, various embodiments of the disclosure have been described. It will, however, be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a semiconductor device, comprising:
   providing a plurality of semiconductor die within a wafer, wherein each semiconductor die comprises an active surface and a backside opposite the active surface;
   forming a build-up interconnect structure that extends over the active surface of each of the plurality of semiconductor die within the wafer;
   forming a unique identifying mark for each of the plurality of semiconductor die as part of a layer within the build-up interconnect structure while simultaneously forming the layer of the build-up interconnect structure, wherein the layer of the build-up interconnect structure comprises both the unique identifying marks for each of the plurality of semiconductor die and functionality for the semiconductor device, wherein each unique identifying mark conveys a unique identity of its respective semiconductor die; and
   singulating the plurality of semiconductor die into a plurality of semiconductor devices.

2. The method of claim 1, further comprising:
   forming the layer of the build-up interconnect structure as a conductive layer;
   forming the unique identifying mark for each of the plurality of semiconductor die as a first portion of the conductive layer; and
   forming a second portion of the conductive layer as a redistribution layer (RDL).

3. The method of claim 1, further comprising forming the unique identifying mark for each of the plurality of semiconductor die within the build-up interconnect structure and away from an exterior surface of the semiconductor package such that the unique identifying mark for each of the plurality of semiconductor die are not subject to damage at an exterior surface of the semiconductor package.

4. The method of claim 1, further comprising forming the unique identifying mark for each of the plurality of semiconductor die within the build-up interconnect structure in a position that is optically detectable from an exterior of the semiconductor device.

5. The method of claim 1, further comprising forming the unique identifying mark as a machine-readable 2-dimensional code or an alpha-numeric mark.

6. The method of claim 1, wherein the unique identity of the semiconductor die conveyed by each of the respective unique identifying marks comprises source wafer identification, and the x, y location of the semiconductor die within the wafer.

7. The method of claim 6, wherein the information conveyed by each of the respective unique identifying marks further comprises a reconstituted wafer or panel identification and an x, y location of the semiconductor device within the reconstituted wafer.

8. The method of claim 7, further comprising forming the reconstituted wafer by disposing an encapsulant around the plurality of semiconductor die before forming the build-up interconnect structure.

9. A method of making a semiconductor device, comprising:
   providing a plurality of semiconductor die, wherein each semiconductor die comprises an active surface and a backside opposite the active surface;
   forming a functional layer as part of a build-up interconnect structure that extends over the active surface of each of the plurality of semiconductor die, the functional layer further comprising a unique identifying mark for each of the plurality of semiconductor die simultaneously with forming the build-up interconnect structure, wherein each unique identifying mark conveys a unique identity of its respective semiconductor die; and
   singulating the plurality of semiconductor die.

10. The method of claim 9, further comprising:
    forming the unique identifying mark for each of the plurality of semiconductor die as a first portion of the build-up interconnect structure; and
    forming a second portion of the build-up interconnect structure as a redistribution layer (RDL).

11. The method of claim 9, further comprising forming the unique identifying mark and the functional layer in the build-up structure with a maskless patterning system.

12. A method of making a semiconductor device, comprising:

providing a plurality of semiconductor die, wherein each semiconductor die comprises an active surface and a backside opposite the active surface;

forming a functional layer that extends over the active surface of each of the plurality of semiconductor die, the functional layer further comprising a unique identifying mark for each of the plurality of semiconductor die, wherein each unique identifying mark conveys a unique identity of its respective semiconductor die, wherein forming the unique identifying marks further comprises forming the unique identifying mark for each of the plurality of semiconductor die away from an exterior surface of a semiconductor package such that the unique identifying mark for each of the plurality of semiconductor die are not subject to damage at an exterior surface of the semiconductor package; and singulating the plurality of semiconductor die.

13. The method of claim 9, further comprising forming the unique identifying mark for each of the plurality of semiconductor die in a position that is optically detectable from an exterior of the semiconductor device.

14. The method of claim 9, further comprising forming the unique identifying mark as a machine-readable barcode or 2-dimensional matrix.

15. The method of claim 9, wherein the unique identity of the semiconductor die conveyed by each of the respective unique identifying marks comprises source wafer identification, an x, y location of the semiconductor die within a source wafer, a reconstituted wafer or panel identification, and an x, y location of the semiconductor device within the reconstituted wafer.

16. The method of claim 14, further comprising forming a reconstituted wafer by disposing an encapsulant around the plurality of semiconductor die before forming the functional layer.

17. The method of claim 9, further comprising interpreting the unique identifying mark of the semiconductor package to derive the unique identity of the semiconductor device.

18. A method of making a semiconductor device, comprising:

providing a plurality of semiconductor die, wherein each semiconductor die comprises an active surface and a backside opposite the active surface;

forming a build-up interconnect structure or functional layer that extends over each of the plurality of semiconductor die, the build-up interconnect structure further comprising:
  a first portion comprising a unique identifying mark for each of the plurality of semiconductor die, wherein each unique identifying mark conveys information about its respective semiconductor die, and
  a second portion formed as a redistribution layer (RDL); and singulating the plurality of semiconductor die.

19. The method of claim 18, further comprising forming the unique identifying mark for each of the plurality of semiconductor die when forming the build-up interconnect structure.

20. The method of claim 18, wherein each unique identifying mark conveys a unique identity of its respective semiconductor die.

21. The method of claim 18, further comprising forming the unique identifying mark and the RDL in the build-up structure with a maskless patterning system.

22. The method of claim 18, further comprising forming the unique identifying mark for each of the plurality of semiconductor die away from an exterior surface of a semiconductor package such that the unique identifying mark for each of the plurality of semiconductor die are not subject to damage at an exterior surface of the semiconductor package.

23. The method of claim 18, further comprising forming the unique identifying mark for each of the plurality of semiconductor die in a position that is optically detectable from an exterior of the semiconductor device.

24. The method of claim 18, wherein the unique identity of the semiconductor die conveyed by each of the respective unique identifying marks comprises one or more of a source wafer identification, an x, y location of the semiconductor die within a source wafer, a reconstituted wafer or panel identification, and an x, y location of the semiconductor device within the reconstituted wafer.

* * * * *